United States Patent
Spinelli et al.

(10) Patent No.: US 7,136,408 B2
(45) Date of Patent: Nov. 14, 2006

(54) INGAN DIODE-LASER PUMPED II-VI SEMICONDUCTOR LASERS

(75) Inventors: Luis A. Spinelli, Sunnyvale, CA (US); Hailong Zhou, Milpitas, CA (US); R. Russel Austin, Half Moon Bay, CA (US)

(73) Assignee: Coherent, Inc., Santa Clara, CA (US)

( * ) Notice: Subject to any disclaimer, the term of this patent is extended or adjusted under 35 U.S.C. 154(b) by 348 days.

(21) Appl. No.: 10/866,907

(22) Filed: Jun. 14, 2004

(65) Prior Publication Data

US 2005/0276301 A1    Dec. 15, 2005

(51) Int. Cl.
*H01S 3/091* (2006.01)
(52) U.S. Cl. .......................................... 372/70; 372/72
(58) Field of Classification Search .................. 372/72, 372/96, 20, 98, 24, 94, 70
See application file for complete search history.

(56) References Cited

U.S. PATENT DOCUMENTS

| | | | | |
|---|---|---|---|---|
| 5,363,395 | A * | 11/1994 | Gaines et al. | 372/45.01 |
| 5,616,177 | A * | 4/1997 | Yamada | 117/102 |
| 5,909,459 | A | 6/1999 | Ishibashi et al. | 372/96 |
| 6,090,637 | A * | 7/2000 | Miller | 438/47 |
| 6,151,342 | A | 11/2000 | Nightingale et al. | 372/36 |
| 6,229,831 | B1 | 5/2001 | Nightingale et al. | 372/36 |
| 6,263,002 | B1 | 7/2001 | Hsu et al. | 372/6 |
| 6,285,702 | B1 | 9/2001 | Caprara et al. | 372/92 |
| 6,494,371 | B1 | 12/2002 | Rekow et al. | 235/454 |
| 6,693,941 | B1 * | 2/2004 | Okazaki et al. | 372/75 |
| 6,859,481 | B1 * | 2/2005 | Zheng | 372/70 |
| 2004/0013154 | A1 | 1/2004 | Zheng | 372/96 |

OTHER PUBLICATIONS

I.V. Sedova et al., "Lasing in Cd(Zn)Se/ZnMgSSe Heterostructures Pumped by Nitrogen and InGaN/GaN Lasers," *Semiconductors*, vol. 38 (2004) No. 9, pp. 1099-1104.*

I.V. Sedova et al., Integration of Cd(Zn)Se/ZnSe and GaN-based lasers for optoelectronic applications in a green spectral range, *Phys. Stat. Sol.*, vol. (c) 1, No. 4 (2004), pp. 1030-1033.

I.V. Sedova et al., "Lasing in Cd(Zn)Se/ZnMgSse Heterostructures Pumped by Nitrogen and InGaN/GaN Lasers," *Semiconductors*, vol. 38, No. 9 (2004), pp. 1099-1104.

K. Rakennus et al., "Growth of II-VI Bragg mirrors by molecular beam epitaxy," *Journal of Crystal Growth*, vol. 159 (1996), pp. 628,631.

(Continued)

*Primary Examiner*—Minsun Oh Harvey
*Assistant Examiner*—Tuan N. Nguyen
(74) *Attorney, Agent, or Firm*—Stallman & Pollock LLP (57) ABSTRACT

A semiconductor laser includes a multilayer semiconductor laser heterostructure including at least one active layer of a II-VI semiconductor material and is optically pumped by one or more indium gallium nitride (InGaN) diode-lasers. Group II elements in the II-VI semiconductor material are zinc, cadmium, magnesium, beryllium, strontium, and barium. Group VI elements in the II-VI semiconductor material are Sulfur, Selenium, and Tellurium. In one example of the laser an edge emitting heterostructure includes two active layers of zinc cadmium selenide, two waveguide layers of zinc magnesium sulfoselenide, and two cladding layers, also of zinc magnesium sulfoselenide. Proportions of elements in the cladding layer material and the waveguide layer material are selected such that the waveguide layer material has a higher bandgap than the material of the waveguide layers. In another example, a two dimensional array of InGaN diode-lasers is arranged to optically pump a one dimensional array of II-VI edge-emitting heterostructure lasers.

18 Claims, 6 Drawing Sheets

OTHER PUBLICATIONS

U. Lunz et al., "Optical properties of $Zn_{1-x}Mg_xS_ySe_{1-y}$ epitaxial layers for blue-green laser applications," *J. Appl. Phys.*, vol. 77, No. 10, May 15, 1995, pp. 5377-5380.

H.Q. Lee et al., "Diode-laser-pumped InGaAs/GaAs/AlGaAs heterostructure lasers with low internal loss and 4-W average power," *Appl. Phys. Lett.*, vol. 63, No. 11, Sep. 13, 1993, pp. 1465-1467.

H.Q. Lee et al., "High-Power diode-laser-pumped midwave infrared HgCdTe/CdZnTe quantum-well lasers," *Appl. Phys. Lett.*, vol. 65, No. 7, Aug.15, 1994, pp. 810-812.

H.Q. Le et al., High-power diode-laser-pumped mid-infrared semiconductor lasers, *SPIE*, vol. 2382 (1995), pp. 262-270.

C. Kruse et al., Investigation of Green Emitting Monolithic II-VI Vertical Cavity Surface Emitting Laser, *Mat. Res. Soc. Symp. Proc.*, vol. 722 (2002)—Materials Research Society, pp. 141-146.

U. Lunz et al., "Optical properties of $Zn_{1-x}Mg_xS_ySe_{1-y}$ epitaxial layers for blue-green laser applications," *Journal of Applied Physics*, vol. 77, No. 10, May 15, 1995, pp. 5377-5380.

K. Rakennus et al., "Growth of II-VI Bragg mirrors by molecular beam epitaxy," *Journal of Crystal Growth*, vol. 159 (1996), pp. 628-631.

I.V. Sedova et al., "Integration of Cd(Zn)Se/ZnSe and GaN-based lasers for optoelectronic applications in a green spectral range," *Phys. Stat. Sol. (c)*, vol. 1 (2004), No. 4, pp. 1030-1033.

IV. Sedova et al., "Lasing in Cd(Zn)Se/ZnMgSSe Heterostructures Pumped by Nitrogen and InGan/GaN Lasers," *Semiconductors*, vol. 38 (2004), No. 9, pp. 1099-1104.

\* cited by examiner

INGAN DIODE-LASER PUMPED II-VI SEMICONDUCTOR LASERS

TECHNICAL FIELD OF THE INVENTION

The present invention relates generally to semiconductor lasers. The invention relates in particular to semiconductor lasers grown from II-VI semiconductor materials and emitting in a blue region of the visible electromagnetic spectrum.

DISCUSSION OF BACKGROUND ART

One potential application for semiconductor lasers is in the illumination of color display devices. In any such device wherein it was desired to provide an accurate color display, it would be necessary to provide at least one semiconductor laser emitting red light, at least one other semiconductor laser emitting green light and at least one further semiconductor laser emitting blue light.

Most commercially available blue-light emitting diode-lasers are made from indium gallium nitride (abbreviated InGaN), a II-V semiconductor having a general formula $In_xGa_{1-x}N$, where x is equal to or greater than 0.0 and less than or equal to 1.0. The lasers can be made to emit at a particular wavelength in a spectral range from about 380 nanometers (nm) in the ultraviolet region of the electromagnetic spectrum to about 460 nm in the blue region of that spectrum by selecting an appropriate value for x.

The blue region of the spectrum is defined as having a spectral range extending from about 425 nm (purplish blue) to about 490 nm (greenish blue). Accordingly, InGaN diode-lasers provide can provide light in only in the shortest 50% of the blue region of the spectrum. It would be advantageous to have a diode-laser capable of emitting light in at least the remaining 50% of the blue region of the spectrum.

Diode-lasers grown from II-VI semiconductor materials such as zinc sulfoselenide $ZnS_xSe_{1-x}$ and $Zn_xCd_{1-x}Se$ (where x is equal to or greater than 0.0 and less than or equal to 1.0) are capable of providing light at wavelengths in a range from about 460 nm in the blue region of the spectrum to about 530 nm in the green region of the spectrum. These lasers, unfortunately, have been found to have relatively short lifetimes, for example less than 1000 hours. It is generally believed that the short lifetime is due to the growth of color centers in the II-VI material originating from doping sites in the material. Doping of the material is necessary to provide the p and n conductive layers which provide the "diode" of the diode-laser. The color centers develop as a result of the passage of current through the diode-laser. A lifetime of less than 1000 hours is at least an order of magnitude shorter than would typically be required for a diode-laser to be commercially viable. There is a need for a blue-light emitting, II-VI semiconductor laser that does not have the limited lifetime problem of prior-art II-VI semiconductor diode-lasers.

SUMMARY OF THE INVENTION

In one aspect, a semiconductor laser in accordance with the present invention comprises a multilayer semiconductor laser heterostructure including at least one active layer of a II-VI semiconductor material having a formula $A_xB_{1-x}C_yD_{1-y}$, where x is equal to or greater than zero and less than or equal to one, y is equal to or greater than zero and less than or equal to one, where A and B are selected from a group of group II elements consisting of (Zn, Cd, Mg, Be, Sr, and Ba), and where C and D are selected from a group of group VI elements consisting of (S, Se, and Te). The laser includes an InGaN semiconductor light-emitting device arranged to optically pump the laser heterostructure.

In one embodiment of the inventive laser, the multilayer semiconductor laser heterostructure is a surface-emitting heterostructure including two mirror structures and a gain structure including a plurality of the active layers spaced apart by spacer layers, also of a II-VI semiconductor material. The two mirrors form a laser resonator with the gain structure being located in the resonator.

In another embodiment of the inventive laser, the multilayer semiconductor laser heterostructure is a surface-emitting heterostructure includes one mirror structure and a gain structure including a plurality of the active layers. A separate mirror is spaced apart from the gain structure and arranged to form a laser resonator with the gain structure being located in the resonator.

In yet another embodiment of the inventive laser, the heterostructure is an edge emitting heterostructure. Reflective facets of the heterostructure form a laser resonator. The InGaN semiconductor light emitting device includes a linear array of diode-lasers. The array of InGaN diode-lasers is spaced-apart from the heterostructure and aligned with a longitudinal axis of the laser resonator.

BRIEF DESCRIPTION OF THE DRAWINGS

The accompanying drawings, which are incorporated in and constitute a part of the specification, schematically illustrate a preferred embodiment of the present invention, and together with the general description given above and the detailed description of the preferred embodiment given below, serve to explain the principles of the present invention.

DETAILED DESCRIPTION OF THE INVENTION

Figure 1:
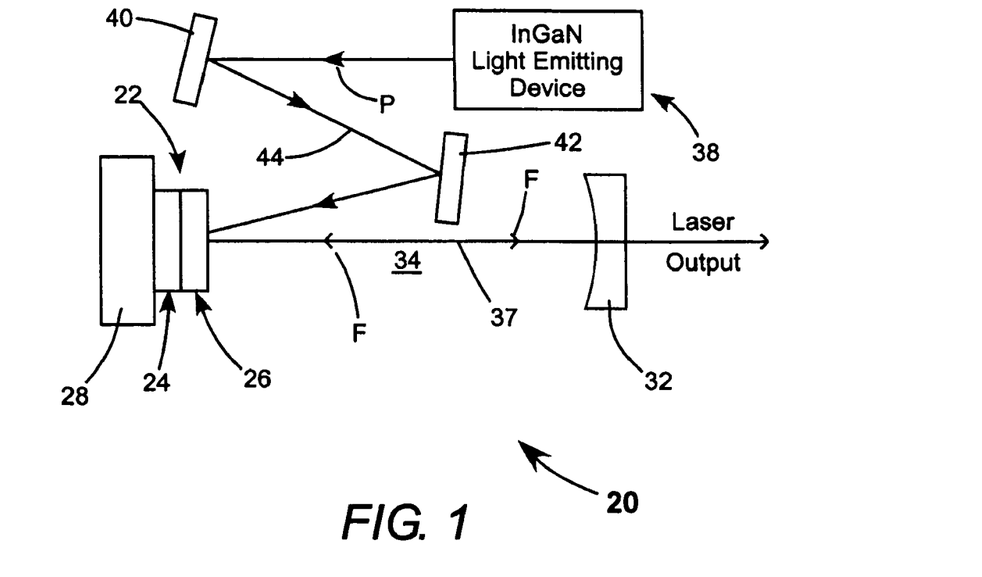
FIG. 1 schematically illustrates one preferred example of an external cavity, InGaN diode-laser pumped, surface-emitting, II-VI semiconductor laser in accordance with the present invention.

Referring now to the drawings, wherein like components are designated by like reference numerals, FIG. 1 schematically illustrates one embodiment 20 of a II-VI semiconductor laser in accordance with the present invention. Laser 20 includes a surface-emitting semiconductor heterostructure 22 including a mirror structure 24 surmounted by a gain-structure 26. Heterostructure 22 is in thermal contact with a substrate, heat sink, or heat spreader 28. Substrate 28, optionally, may be a substrate on which the heterostructure is grown.

Gain structure 26 includes a plurality of active layers of a II-VI semiconductor material having a formula $A_xB_{1-x}C_yD_{1-y}$, where x is equal to or greater than zero and less than or equal to one; y is equal to or greater than zero and less than or equal to one; where A and B are selected from a group of group II elements consisting of (Zn, Cd, Mg, Be, Sr, and Ba); and where C and D are selected from a group of group VI elements consisting of (S, Se, and Te). The selection of materials for A, B, C, and D and the values of x and y, inter alia, determines the emitting (lasing) wavelength of laser 20. Examples of gain structure 26 and mirror structure 24 are presented hereinbelow. A concave mirror 32 forms a laser resonator 34 with mirror structure 24 of heterostructure 22.

Pump light is supplied by a InGaN light-emitting device 38. Light-emitting device 38 preferably includes an InGaN diode-laser or an array of InGaN diode-lasers. InGaN light-emitting device 38, alternatively, may include a plurality of InGaN light-emitting diodes (LEDs). Light delivered from light-emitting device 38 is directed by mirrors 40 and 42 along a path 44 into gain structure 26, as indicated by solid arrowheads P. Pump light P is absorbed in the gain structure and optically pumps (energizes) the gain structure. In response to the optical pumping of gain structure 26, laser radiation circulates in the resonator generally along a longitudinal resonator axis 37 as indicated by open arrowheads F. Mirror 32 is partially transparent to the wavelength of the laser radiation and allows the laser radiation to be delivered from resonator 34 as output radiation.

Figure 2:
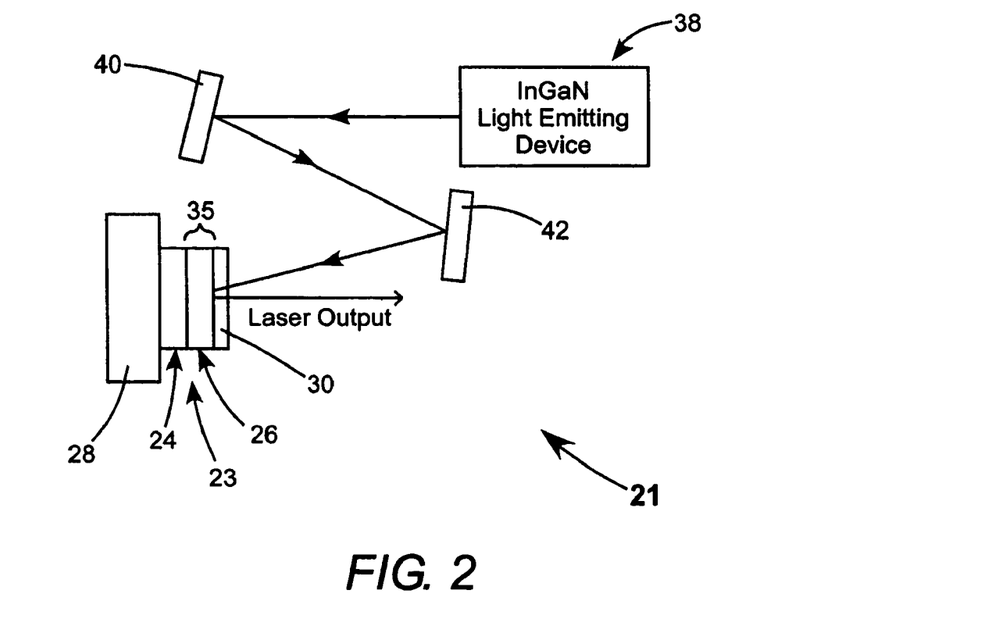
FIG. 2 schematically illustrates one preferred example of an InGaN diode-laser pumped, monolithic, surface-emitting, II-VI semiconductor laser in accordance with the present invention.

FIG. 2 schematically illustrates another embodiment 21 of a II-VI semiconductor laser in accordance with the present invention. Laser 21, is optically pumped by light from a InGaN light-emitting device 38. Laser 21 includes a surface-emitting semiconductor heterostructure 23 including a mirror structure 24 surmounted by a gain-structure 26. Gain structure 26 is surmounted by a second mirror structure 30. Mirror structures 24 and 30 form a very short (only a few micrometers long) resonator 35 including the gain structure 26. Mirror structure 30 is partially reflective and partially transmissive for the emitting wavelength of gain structure 26 and highly transparent, for example, greater than about 95% transparent, for the wavelength of the pump light P. Optical pump light from InGaN light-emitting device 38 is delivered to gain structure 26 through mirror structure 30. Laser output radiation is delivered from resonator 35 through mirror 30.

Figure 3:
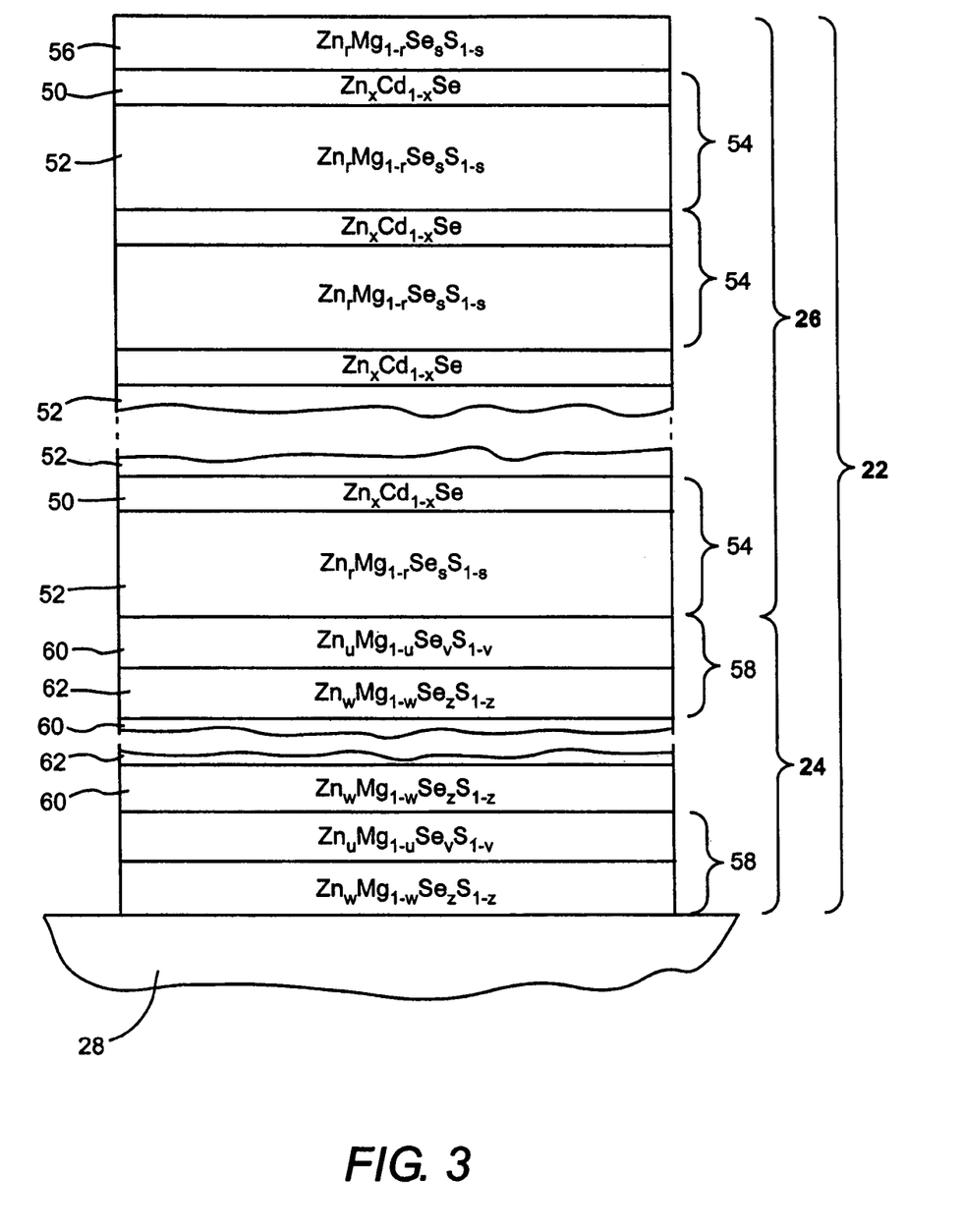
FIG. 3 schematically illustrates details of one example of a multilayer semiconductor heterostructure including a mirror-structure surmounted by a gain structure in the laser of FIG. 1.

Referring now to FIG. 3, one preferred II-VI semiconductor multilayer gain structure 26 of heterostructure 22 includes a plurality of active (quantum-well) layers 50 of a II-VI semiconductor material zinc cadmium selenide having a formula $Zn_xCd_{1-x}Se$. Layers 50 preferably have a thickness of about 150 nm or less. The layer thickness is exaggerated, relative to that of other layers in FIG. 3, for convenience of illustration. The value of x is selected according to the desired emission (laser radiation) wavelength. Active layers 50 are spaced apart by pump-light-absorbing spacer-layers 52 of another II-VI semiconductor material, zinc magnesium sulfoselenide, having a formula $Zn_rMg_{1-r}Se_sS_{1-s}$, where $0.0 \leq r \leq 1.0$, and $0.0 \leq s \leq 1.0$. Each layer 50, and an adjacent layer 52, form a layer pair 54 having a total optical thickness of about one-half wavelength at the emitting wavelength. Gain structure 26 is completed by a cap layer 56, also of $Zn_rMg_{1-r}Se_sS_{1-s}$. Cap layer 56 preferably has a thickness of about one-half wavelength at the emitting wavelength. However, as this layer does not separate active layers, it may have some different thickness.

A preferred number of layer pairs, i.e., a preferred number of active layers 50, is between about 10 and 20. Values of r and s in the material of a spacer layer 52 are selected to provide a desired level of absorption of pump light P, and, accordingly, will depend, among other factors, on the wavelength selected for the pump light. It is possible, albeit time taking in practice, to systematically change the vales of r and s such that the absorption of layers 52 increases with increasing proximity of the layers to mirror structure 24. This can be arranged such that most or all pump light is absorbed in the gain structure, and little or no pump light reaches mirror structure 24.

In the example of FIG. 3, mirror structure 24 is formed from a plurality of layer, pairs 58 each thereof including a layer 60, and a layer 62 having a refractive index less than that of layer 60. Layer 60 is formed from zinc magnesium sulfoselenide having a composition $Zn_uMg_{1-u}Se_vS_{1-v}$ where $0.0 \leq u \leq 1.0$, and $0.0 \leq v \leq 1.0$. Layer 62 is formed from zinc magnesium sulfoselenide having a composition $Zn_wMg_{1-w}Se_zS_{1-z}$, where $0.0 \leq w \leq 1.0$, and $0.0 \leq z \leq 1.0$. Preferably, layers 60 and 62 each have an optical thickness of about one-quarter wavelength at the emitting wavelength of gain structure 26.

Mirror structure 24 preferably has a reflectivity greater than 99% at the emission wavelength of gain structure 26. About fifteen layer pairs 58 may be required to provide a reflectivity greater than 99% with the exemplified refractive index values.

In one example of heterostructure 22, for emitting at 460 nm, layer 50 preferably has a composition ZnSe (x=1.0), and spacer layers 52 preferably have a formula $Zn_{0.87}Mg_{0.13}Se_{0.85}S_{0.15}$. Mirror layer 60 preferably has a composition $Zn_{0.91}Mg_{0.09}Se_{0.88}S_{0.12}$ and mirror layer 62 preferably has a composition $MgSe_{0.14}S_{0.86}$. In another example of a heterostructure 22, for emitting at 488 nm, layer 50 preferably has a composition $Zn_{0.85}Cd_{0.15}Se$, and spacer layers 52 preferably have a formula $ZnSe_{0.925}S_{0.075}$. Mirror layer 60 preferably has a composition $ZnSe_{0.94}S_{0.0.06}$, and mirror layer 62 preferably has a composition $MgSe_{0.14}S_{0.86}$. In yet another example of a heterostructure 22, for emitting at 532 nm, layer 50 preferably has a composition $Zn_{0.7}Cd_{0.3}Se$; and spacer layers 52 preferably have a formula $ZnSe_{0.91}S_{0.09}$. Mirror layer 60 preferably has a composition $ZnSe_{0.94}S_{0.0.06}$, and mirror layer 62 preferably has a composition $MgSe_{0.14}S_{0.86}$.

In a preferred method of growing a heterostructure 22, gain structure 26 is grown on a GaAs substrate (not shown) beginning with cap layer 56 and mirror structure 24 is then epitaxially grown on the gain structure. After such mirror structure has been grown deposited, mirror structure 24 of heterostructure 22 can be bonded to a substrate 28 in the form of a heat sink, or a diamond or sapphire heat spreader, and original epitaxial growth substrate removed from gain structure 26 by selective etching.

The epitaxial mirror structure of FIG. 3 is preferred for optimally transferring heat developed in the heterostructure into substrate 28. Such a mirror structure, however, can become highly stressed during the growth process and can cause the heterostructure to be mechanically unreliable. Mirror structure 24, however, can then be formed on the gain structure by vacuum evaporation (non-epitaxial growth) of alternating, quarter-wave optical thickness layers of high and low refractive dielectric materials, such as tantalum oxide ($Ta_2O_5$) and silicon dioxide ($SiO_2$), respectively. Only about eight layer pairs 58 of these materials would be required to achieve a reflectivity greater than 99%. The lesser total thickness of the dielectric mirror structure compared with the epitaxial structure of FIG. 3 compensates somewhat for the poorer thermal conductivity of the dielectric materials compared with the semiconductor materials. Whichever of the above-described mirror structures 24 is used to form a heterostructure 22, that heterostructure can be converted to the heterostructure 23 of the monolithic laser 21 of FIG. 2 by vacuum depositing high and low refractive index dielectric layers to form mirror 30 on gain structure 26.

Figure 4:
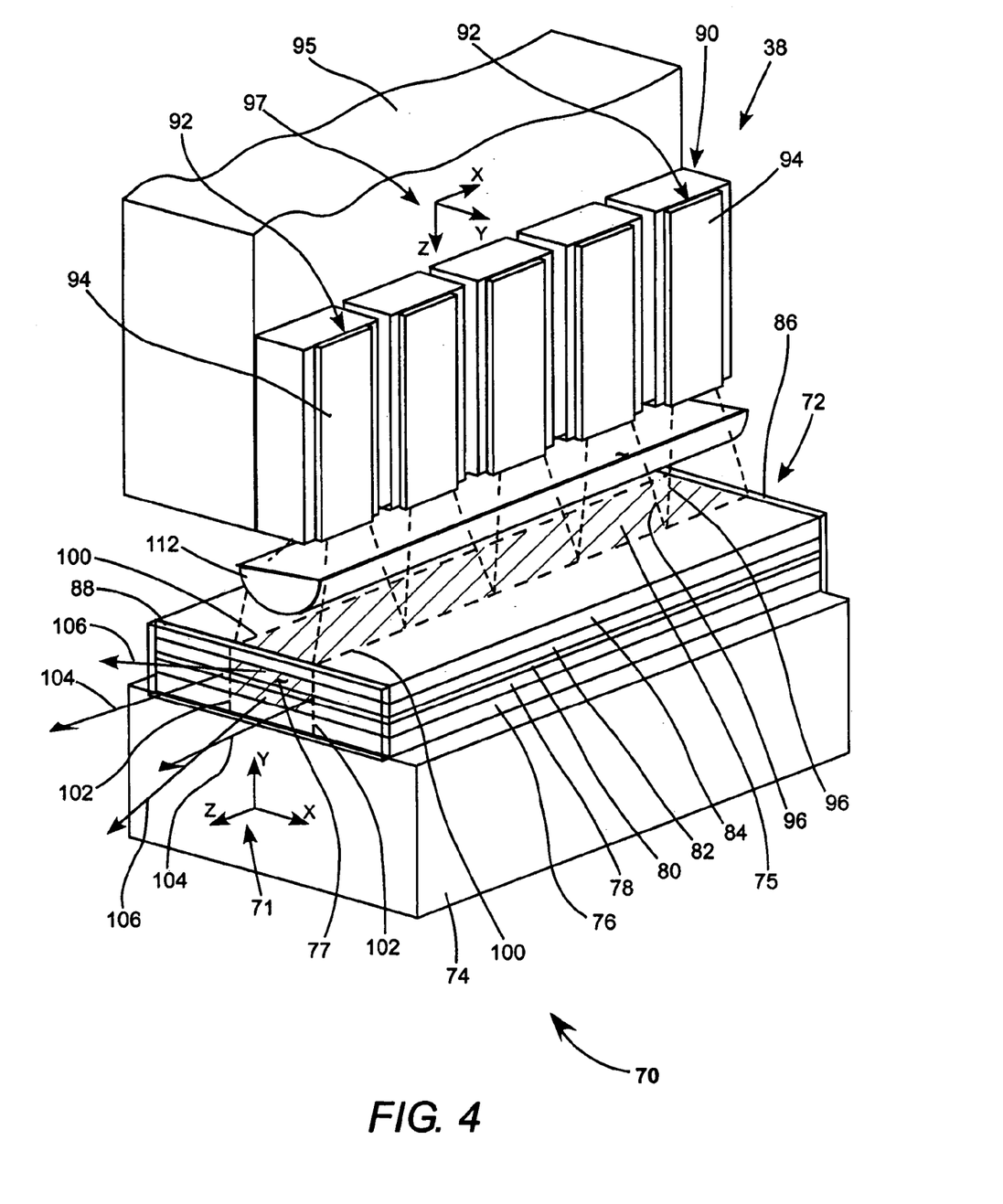
FIG. 4 schematically illustrates one preferred embodiment of an InGaN diode-laser pumped, edge-emitting II-VI semiconductor laser in accordance with the present invention.

FIG. 4 schematically illustrates yet another embodiment 70 of a II-VI semiconductor laser in accordance with the present invention. Laser 70 includes an edge emitting heterostructure 72. Heterostructure 72, here schematically depicted in a basic form, includes a lower cladding (carrier confinement) layer 76, a lower waveguide (optical confinement) layer 78, an active (quantum-well) layer 80, an upper waveguide layer 82 and an upper cladding layer 84. Active layer 80 is formed from a II-VI semiconductor material as defined above for active layers 50 of laser 20. It should be noted here that the terminology "upper" and "lower" as applied to layers of heterostructure 72 are used merely for convenience of description and do not necessarily relate to gravitationally determined "up" or "down".

On one end or facet of heterostructure 72 is a reflective coating 86 configured to provide maximum reflectivity, for example, greater than 99% reflectivity at the emitting wavelength of the heterostructure. On an opposite end (facet) of heterostructure 72 is a (optional) partially reflective, partially transmissive coating 88. Those skilled in the art to which the present invention pertains will recognize that should coating 88 be omitted the uncoated facet will have a reflectivity of about 21% due to the relatively high refractive index (about 2.7) of the layers of the heterostructure.

Heterostructure 72 is optically pumped by an InGaN light-emitting device 38, here, in the form of linear array 90 of diode-lasers 92. The diode-lasers are electrically pumped via electrodes 94. Diode-lasers 92 in array 90 are in thermal contact with a common heat sink 95. Diode-lasers 92 are spaced apart from each other in array 90, and array 90 is spaced apart from heterostructure 72 such that light beams from adjacent ones of the diode-lasers overlap in the slow axis (the X-axis, as depicted in Cartesian coordinate system 97). This is indicated by short-dashed lines 96. An elongated cylindrical microlens 112 has positive dioptric power in the fast axis of array 9 (the Y-axis, as depicted in Cartesian coordinate system 97) and zero dioptric power in the slow axis of array 90. Microlens 112 is aligned with the length thereof parallel to the slow axis of array 90 and spaced apart from the array such that light from the diode-lasers is collimated. As the microlens has zero optical power in the slow axis, the divergence of light from the diode-lasers in the slow axis is unchanged. This allows the separation of array 90 and heterostructure 72 to be adjusted to achieve a desired slow axis overlap while maintaining a constant beam dimension in the fast axis.

The diode-laser array 90 illuminates a "stripe" 75 of heterostructure 72 having a width (designated in FIG. 4 by long-dashed lines 100) about equal to the fast axis beam width of the diode-lasers at microlens 112. The coatings (reflective facets) 86 and 88 form an elongated, gain guided, waveguide laser resonator in the stripe region. Laser radiation is emitted from an emitting aperture (hatched area 77) having a width about equal to the stripe width, as defined by short-dashed lines 102, and a height about equal to the total thickness of quantum well layer 80 and upper and lower waveguide layers 82 and 78. The resonator has a longitudinal axis (not explicitly shown) parallel to the Z-axis of Cartesian coordinate system 71 of FIG. 4. The emitted laser radiation has a relatively narrow divergence, for example about 10° half-angle, in the slow axis (X-axis of coordinate system 71) as indicated by rays 104. The emitted laser radiation has a relatively wide divergence, for example about 35° half-angle, in the fast axis (X-axis of coordinate system 71) as indicated by rays 104. Here, it should be noted that coordinate system 97 is specific to diode-laser bar 90 and emitters 92 thereof, while coordinate system 71 is specific to heterostructure 72 and emitter 77 thereof.

Figure 5:
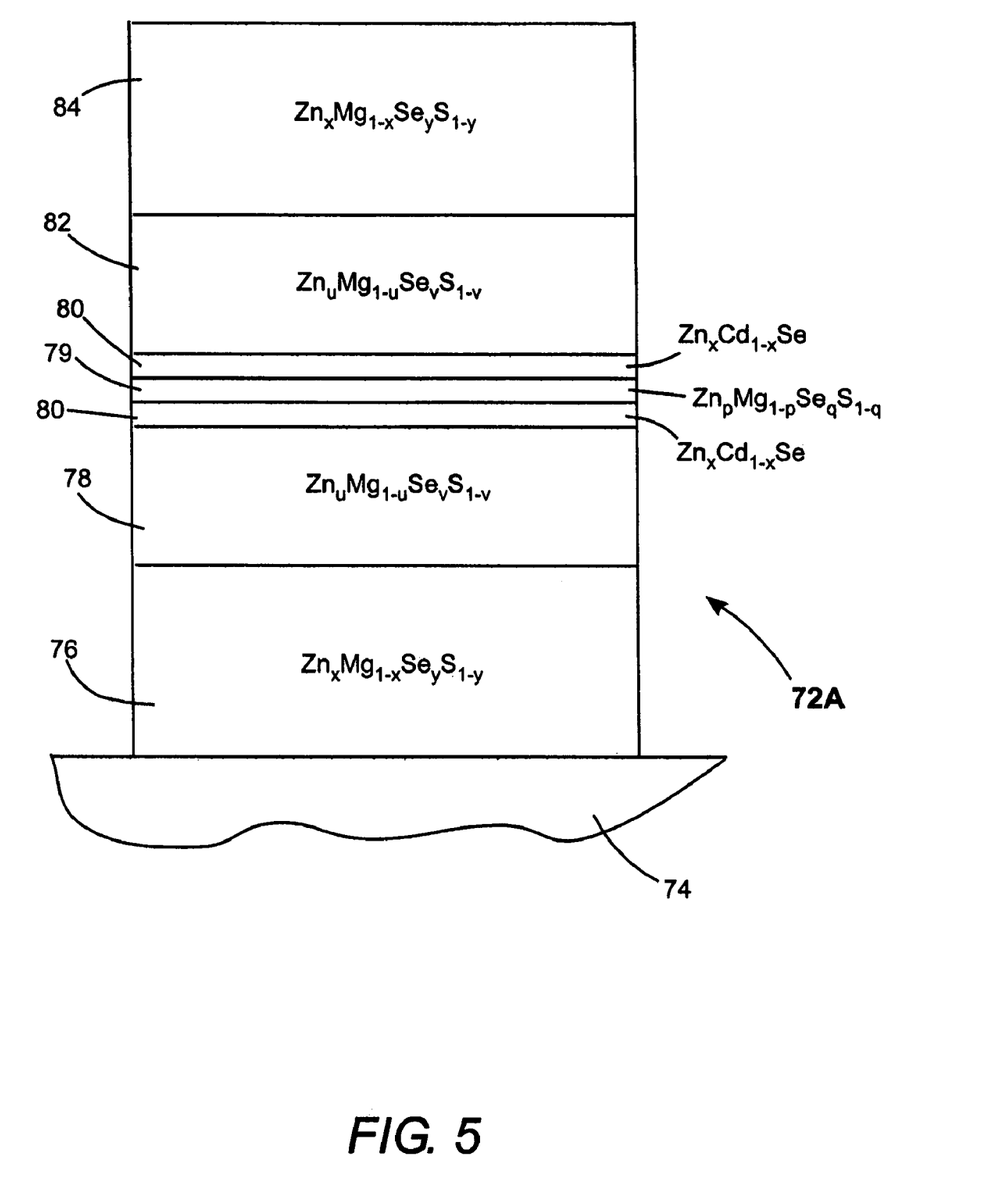
FIG. 5 schematically illustrates details of one example of a multilayer semiconductor heterostructure in the laser of FIG. 4.

FIG. 5 schematically illustrates one preferred II-VI semiconductor multilayer edge-emitting heterostructure 72A for above-described laser 70. Heterostructure 72A is similar to heterostructure 72 with an exception that heterostructure 72A includes two quantum well layers 80 separated by a barrier layer 79. Layers 80 are formed from $Zn_xCd_{1-x}Se$. Layers 50 preferably have a thickness of about 150 nm or less. The layer thickness is exaggerated in FIG. 5 for convenience of illustration. The value of x is selected according to the desired emission (laser radiation) wavelength as discussed above with reference to surface-emitting heterostructure 22. Barrier layer 79 has about the same thickness as that of the quantum well layers and is formed from zinc magnesium sulfoselenide having a composition $Zn_pMg_{1-p}Se_qS_{1-q}$, where $0.0 \leq r \leq 1.0$, and $0.0 \leq s \leq 1.0$.

Upper and lower waveguide layers 82 and 78 preferably have a thickness of about 500 nm and are formed from zinc magnesium sulfoselenide having a composition $Zn_uMg_{1-u}Se_vS_{1-v}$, where $0.0 \leq r \leq 1.0$, and $0.0 \leq s \leq 1.0$. Values of u and v are selected such that the waveguide layers have a higher bandgap than that of the quantum well layers.

Upper and lower cladding layers 84 and 76 preferably have a thickness of about 1.0 micrometers (μm) or greater and are formed from zinc magnesium sulfoselenide having a composition $Zn_xMg_{1-x}Se_yS_{1-y}$, where $0.0 < r < 1.0$, and $0.0 < s < 1.0$. Values of x and y are selected such that the cladding layers have a higher bandgap than that of the waveguide layers.

In one example of heterostructure 72 for emitting at 460 nm, quantum well layers 80 preferably have a composition ZnSe (x=1.0); waveguide layers 78 and 82 preferably have a composition $Zn_{0.87}Mg_{0.13}Se_{0.85}S_{0.15}$; and cladding layers 76 and 84 preferably have a composition $Zn_{0.78}Mg_{0.22}Se_{0.79}S_{0.21}$. In another example of a heterostructure 72 for emitting at 488 nm, quantum well layers 80 preferably have a composition $Zn_{0.85}Cd_{0.15}Se$; waveguide layers 78 and 82 preferably have a composition $ZnSe_{0.94}S_{0.06}$; and cladding layers 76 and 84 preferably have a composition $Zn_{0.91}Mg_{0.09}Se_{0.88}S_{0.0.12}$. In yet another example of a heterostructure 72 for emitting at 532 nm, quantum well layers 80 preferably have a composition $Zn_{0.7}Cd_{0.3}Se$; waveguide layers 78 and 82 preferably have a composition $ZnSe_{0.94}S_{0.06}$; and cladding layers 76 and 84 preferably have a composition $Zn_{0.91}Mg_{0.09}Se_{0.88}S_{0.0.12}$.

Figure 6:
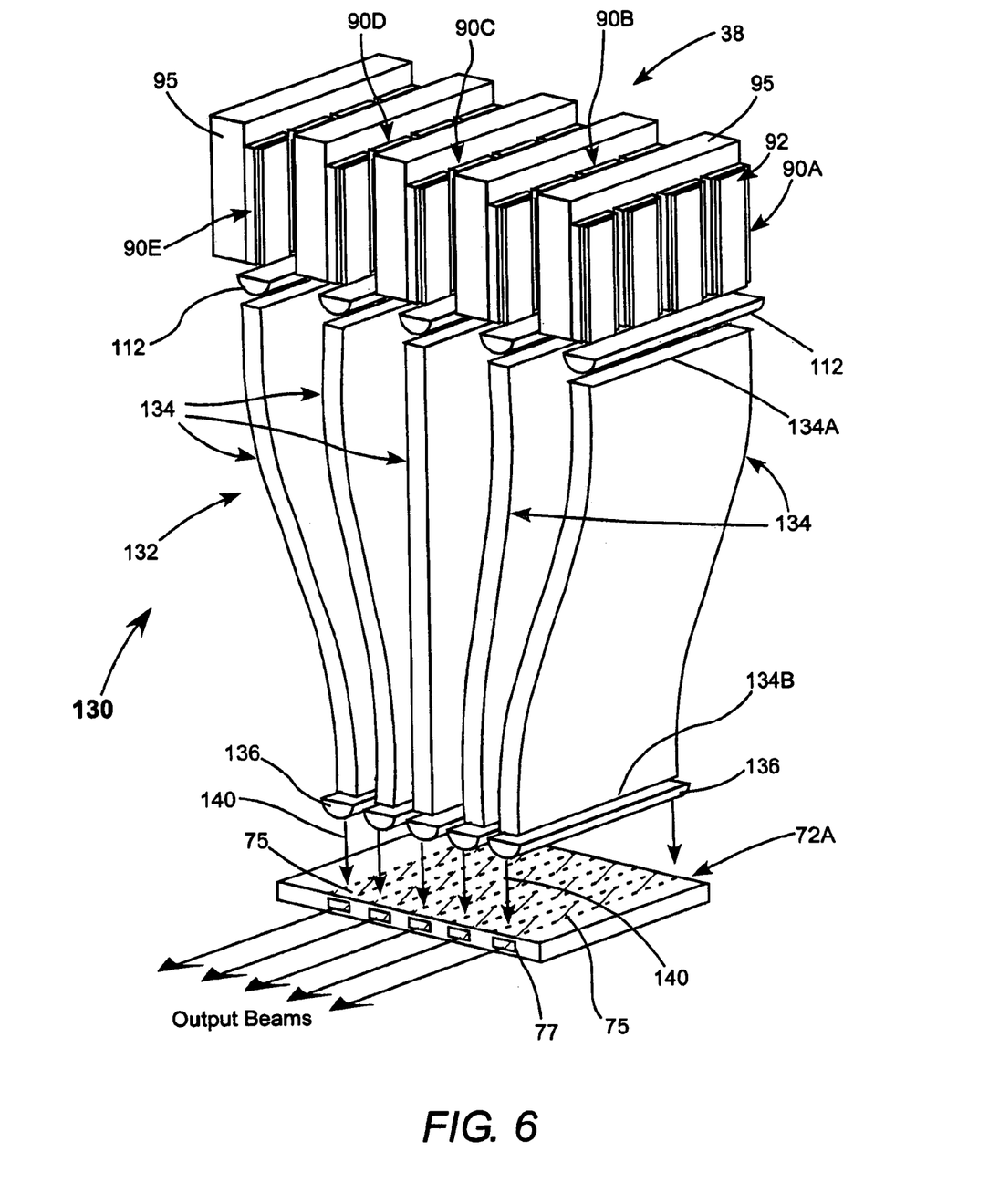
FIG. 6 is a three-dimensional view schematically illustrating another preferred embodiment of a linear array of InGaN diode-laser pumped, edge-emitting II-VI semiconductor lasers in accordance with the present invention, including a planar waveguide arrangement for transporting pump light beams from a two dimensional array of InGaN diode-lasers to pump an array of edge-emitting II-VI semiconductor lasers.

FIG. 6 schematically illustrates another preferred embodiment 130 of a linear array of InGaN diode-laser pumped, edge-emitting II-VI semiconductor lasers in accordance with the present invention. Laser 110 includes an elongated II-VI edge-emitting semiconductor heterostructure 72A. Heterostructure 72A has a layer structure similar to that structure described above with respect to FIG. 5 and to laser 70 of FIG. 4.

Pump light is supplied by an InGaN light emitting device 38 including linear arrays 90A–E of InGaN diode-lasers 92. Diode-lasers in each array are mounted on common heatsink 95. Each diode-laser bar 90 is provided with a cylindrical microlens 112 arranged to collimate fast axis rays from diode-lasers 92 in the diode-laser array. Each diode-laser array is intended to irradiate a particular stripe 75 on heterostructure 72A.

An array 132 of strip or planar waveguides 134 serves to transport light from the InGaN diode-laser bars 90 to heterostructure 72A. Input ends 134A of the planar waveguides are parallel to each other, and are spaced apart to correspond to the fast-axis spacing of the diode-laser bars. Waveguides 134 are variously shaped along the length thereof such that exit ends 134B are spaced apart according to a desired spacing of stripes 77 and individual emitters 77 in heterostructure 72A. Proximate the output end 134B of each waveguide 134 is a cylindrical microlens 136 configured and arranged to collimate light emitted from the waveguides. Here, five separate collimated beams 140 (indicated in FIG. 6 by single arrows only) pump the five spaced-apart parallel elongated regions or "stripes" 75 of heterostructure 72A.

Waveguides 134 are preferably formed from ultraviolet (UV) grade fused silica. Individual waveguides can be cut from a ground and polished sheet of a desired thickness. Edges, entrance faces and exit faces of the waveguides can be polished by temporarily blocking together a number of the cut waveguides, polishing the edges, and the entrance and exit faces of the waveguides, then dismantling the block to release individual polished waveguides. The individual polished waveguides can then be shaped longitudinally, if necessary. By way of example, shaping of a waveguide can be accomplished by heating the waveguide to a softening temperature and "slumping" the waveguides onto a mandrel including a surface having the desired waveguide shape.

One advantage of using a waveguide to transport radiation from an InGaN diode-laser bar to pump an edge-emitting, II-VI semiconductor laser in accordance with the present invention is that the waveguide will tend to homogenize the light output from the InGaN diode-laser bar along a direction corresponding to the X-axis (slow axis) thereof. This will tend to provide uniformity of pumping along the Z-axis (longitudinal axis) of the II-VI semiconductor laser. The actual uniformity obtained will depend, inter alia, on the width and spacing of emitting apertures of the InGaN diode-laser bar and the length, width and height of the waveguide.

Another means of achieving uniformity of pumping along the Z-axis of an edge-emitting, II-VI semiconductor laser in accordance with the present invention is to project the light from an InGaN diode-laser bar using an optical system configured to project a line or strip of light in which light from each individual emitter in the bar contributes to illuminating the entire length of the projected strip. A brief description of an embodiment of the inventive edge-emitting, II-VI semiconductor laser optically pumped in this manner is set forth below with reference to FIG. 7

Figure 7:
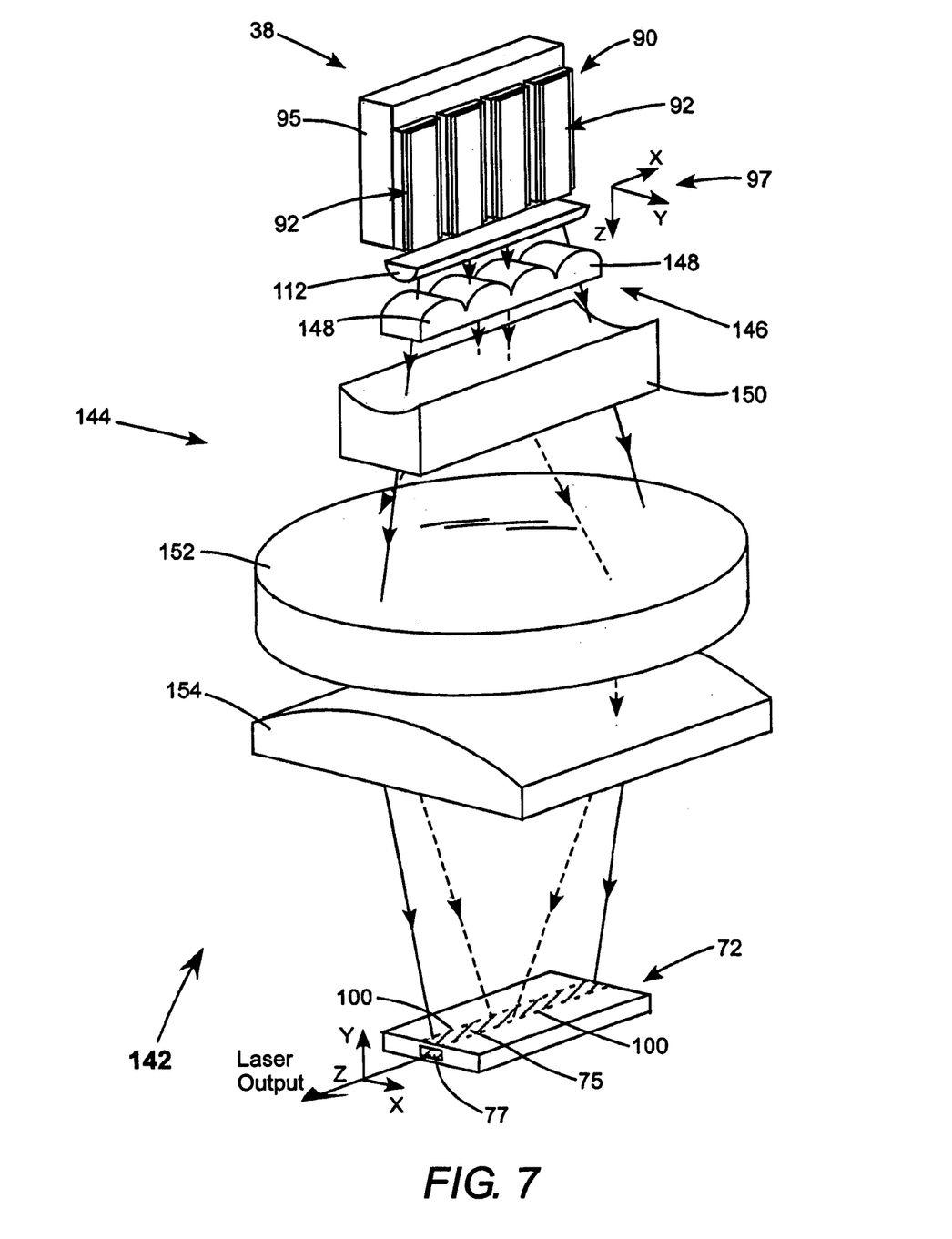
FIG. 7 schematically illustrates one example of an InGaN diode-laser array pumped, edge-emitting II-VI semiconductor laser in accordance with the present invention including an optical system projecting light from the InGaN diode-laser array to form a uniform strip of light on a II-VI semiconductor heterostructure the uniform strip defining the edge-emitting semiconductor laser.

Here, a laser 142 includes an InGaN light-emitting device 38, in the form of an InGaN diode-laser array 90 including a plurality of diode-lasers 92. The diode-laser bar is mounted on a heat sink 95. Diode-laser array 90, in this example, includes four diode-lasers but this should not be construed as limiting the present invention.

The X, Y and Z-axes (fast, slow and propagation axes respectively) of diode-laser bar 90 are indicated in FIG. 7 generally by a coordinate system 97. An optical system 144 combines light from all diode-lasers in diode-laser bar 90 to form a line or strip of light 75 (indicated in FIG. 9 as a hatched area bounded by dotted lines 100) on heterostructure 72. Light strip 75 is aligned with the longitudinal axis (Z-axis or propagation direction) of an emitter 77 in heterostructure 72.

Optical system 144 has X, Y, and Z-axes (fast, slow, and longitudinal axes respectively) corresponding to the X, Y, and Z axes of diode-laser bar 90. It should be noted that these axes correspond, generally, to the Z, X and Y axes of emitter 77 of heterostructure 72 as in other above-discussed embodiments of the inventive edge emitting lasers. Rays traced through optical system in the X-Z plane thereof (slow axis rays) are designated by solid lines. Rays traced through optical system in the Y-Z plane thereof (fast axis rays) are designated by dashed lines.

Optical system includes a positive cylindrical lens 112 that collimates fast-axis rays from diode-lasers 92 of the diode-laser bar. An array 146 of positive cylindrical lenses 148 includes one cylindrical lens 148 for each diode-laser 92 in diode-laser bar 90. The cylindrical lenses focus slow-axis rays through an intermediate pupil (not shown) of optical system 144 between lens array 146 and a negative cylindrical lens 150. These rays are then diverging on reaching lens 150. Lens 150 causes collimated fast-axis rays from lens 112 to diverge. The diverging fast-axis rays are focused by a combination of a positive, spherical doublet lens 152 and a positive cylindrical lens 154 and define the width of strip 75 (the height of the strip in terms of optical system 144). The diverging slow-axis rays are collimated by a combination of lenses 152 and 154 and define the length of strip 75.

It should be noted here that light-strip projecting optical systems in other configurations are known in the art to which the present invention pertains. Accordingly, only sufficient description of optical system 144 is provided herein to illustrate optically pumping the inventive II-VI semiconductor laser with a line or strip of light projected by such an optical system. A detailed description of an optical system similar to optical system 144 is provided in U.S. patent application Ser. No. 10/667,675, filed Sep. 22, 2003, the complete disclosure of which is hereby incorporated by reference. The diverging fast-axis rays are focused by a combination of a positive, spherical doublet lens 152 and a positive cylindrical lens 154. The focused fast-axis rays define the width of strip 75 (the height of the strip in terms of optical system 144).

In summary, the present invention is described above in terms of preferred embodiments thereof. The invention however, is not limited to the embodiments described and depicted. Rather the invention is limited only by the claims appended hereto.

What is claimed is:

1. A semiconductor laser comprising:
  a surface emitting multilayer semiconductor laser heterostructure including a first mirror structure and a gain structure, said gain structure including at least one active layer of a II-VI semiconductor material having a formula $A_xB_{1-x}C_yD_{1-y}$ where $1.0 \geq x \geq 0.0$, $1.0 \geq y \geq 0.0$, where A and B are selected from a group of group II elements consisting of (Zn, Cd, Mg, Be, Sr, and Ba), and where C and D are selected from a group of group VI elements consisting of (S, Se, and Te);

an InGaN semiconductor light-emitting device arranged to optically pump said laser heterostructure; and a mirror spaced apart from said semiconductor laser heterostructure and arranged to form a laser resonator with said first mirror structure, said laser resonator including said gain structure.

2. The laser of claim 1, wherein said gain structure includes a plurality of said active layers said active layers having spacer layers therebetween, said spacer layers having a formula $A_pB_{1-p}C_qD_{1-q}$, where $1.0 \geq p \geq 0.0$, $1.0 \geq q \geq 0.0$, where A and B are selected from a group of group II elements consisting of (Zn, Cd, Mg, Be, Sr, and Ba), and where C and D are selected from a group of group VI elements consisting of (S, Se, and Te).

3. A semiconductor laser comprising:

a surface-emitting multilayer semiconductor laser heterostructure including a gain structure surmounting a first mirror structure includes a plurality of layer pairs one of the layers in a said layer pair being a layer of $MgSe_zS_{1-z}$ where $1.0 \geq z \geq 0.0$, and the other of the layers in a said layer pair being a layer of $Zn_uMg_{1-u}Se_vS_{1-v}$ where $1.0 \geq u \geq 0.0$; $1.0 \geq v \geq 0.0$; said gain structure including a plurality layer groups, each of said layer groups including an active layer of $Zn_xCd_{1-x}Se$, where $1.0 \geq x \geq 0.0$; $1.0 \geq y \geq 0.0$ and a spacer layer of $Zn_pMg_{1-p}Se_qS_{1-q}$, where $1.0 \geq p \geq 0.0$; $1.0 \geq q \geq 0.0$; and an InGaN semiconductor light-emitting device arranged to deliver optical pump light to said gain structure.

4. The laser of claim 3, further including a mirror spaced apart from said gain structure of said heterostructure and forming a laser resonator with said first mirror structure.

5. The laser of claim 3, wherein said heterostructure includes a second mirror structure surmounting said gain structure, said second mirrors forming a laser resonator with said first mirror structure.

6. The laser of claim 3, wherein said active layers are layers of ZnSe, said spacer layers are layers of $Zn_{0.87}Mg_{0.13}Se_{0.85}S_{0.15}$, and said heterostructure emits light at a wavelength of about 460 nm.

7. The laser of claim 3, wherein said active layers are layers of $Zn_{0.85}Cd_{0.15}Se$, said spacer layers are layers of $ZnSe_{0.925}S_{0.075}$, and said heterostructure emits light at a wavelength of about 488 nm.

8. The laser of claim 3, wherein said active layers are layers of $Zn_{0.7}Cd_{0.3}Se$, said spacer layers are layers of $ZnSe_{0.91}S_{0.09}$, and said heterostructure emits light at a wavelength of about 532 nm.

9. Optical apparatus, comprising:

an edge emitting multilayer semiconductor laser heterostructure including at least one active layer of a II-VI semiconductor material having a formula $A_xB_{1-x}C_yD_{1-y}$, where $1.0 \geq x \geq 0.0$, $1.0 \geq y \geq 0.0$, where A and B are selected from a group of group II elements consisting of (Zn, Cd, Mg, Be, Sr, and Ba), and where C and D are selected from a group of group VI elements consisting of (S, Se, and Te); and a linear array of InGaN diode-lasers arranged to deliver optical pump light to an elongated region of said II-VI semiconductor heterostructure, said elongated region of pump light defining an optically pumped II-VI semiconductor laser in said heterostructure wherein said InGaN diode-laser array has a slow axis aligned parallel to the length direction thereof and a fast axis perpendicular to said slow axis, and wherein there is an elongated cylindrical microlens aligned with said linear array of InGaN diode-lasers, said cylindrical microlens being configured and arranged to collimate light from said InGaN diode-lasers said fast axis thereof without changing the divergence of light from said InGaN diode-lasers in said slow axis.

10. A linear array of optically pumped edge emitting semiconductor lasers, comprising:

an edge-emitting multilayer semiconductor laser heterostructure including at least one active layer of a II-VI semiconductor material having a formula $A_xB_{1-x}C_yD_{1-y}$, where $1.0 \geq x \geq 0.0$, $1.0 \geq y \geq 0.0$, where A and B are selected from a group of group II elements consisting of (Zn, Cd, Mg, Be, Sr, and Ba), and where C and D are selected from a group of group VI elements consisting of (S, Se, and Te);

a plurality of linear arrays of InGaN diode-lasers for generating optical pump light;

a first plurality of elongated microlenses each one there of associated with a particular one of said plurality of InGaN diode-laser arrays;

a plurality of planar optical waveguides corresponding each one there of associated with a particular one of said first plurality of elongated microlenses;

a second plurality of elongated micro lenses each one there of associated with a particular one of said plurality of planar optical waveguides;

said first plurality of microlens being arranged to project optical pump light from said InGaN diode-laser arrays into said first ends of said planar optical waveguides such that said optical pump light propagates along said planar optical waveguides and is delivered from said second ends thereof; and said second plurality of microlenses arranged to receive said optical pump light from said second ends of said planar optical waveguides and project said optical pump light onto a corresponding plurality of spaced-apart parallel elongated regions of said II-VI semiconductor heterostructure, said elongated pump light regions defining a corresponding plurality of optically pumped, edge-emitting, II-VI semiconductor lasers in a linear array in said heterostructure.

11. An optically pumped semiconductor laser, comprising:

a multilayer II-VI semiconductor surface emitting heterostructure surmounting a mirror structure, said surface emitting heterostructure including a plurality of active layers having a formula $A_xB_{1-x}C_yD_{1-y}$, where $1.0 \geq x \geq 0.0$, $1.0 \geq y \geq 0.0$, where A and B are selected from a group of group II elements consisting of (Zn, Cd, Mg, Be, Sr, and Ba), and where C and D are selected from a group of group VI elements consisting of (S, Se, and Te);

a mirror spaced apart from said heterostructure and arranged to form a laser resonator with said mirror structure with said surface emitting heterostructure located in said laser resonator;

an InGaN light emitting device arranged to deliver optical pump light to said surface emitting heterostructure, thereby energizing said surface emitting heterostructure and causing laser radiation to circulate in said laser resonator; and said mirror being partially transparent to said laser radiation whereby said laser radiation is delivered from said resonator as output radiation.

12. A semiconductor laser comprising:

a multilayer semiconductor laser heterostructure including at least one active layer of a II-VI semiconductor material having a formula $A_xB_{1-x}C_yD_{1-y}$, where $1.0 \geq x \geq 0.0$, $1.0 \geq y \geq 0.0$, where A and B are selected from a group of group II elements consisting of (Zn, Cd, Mg, Be, Sr, and Ba), and where C and D are selected from a group of group VI elements consisting of (S, Se, and Te) said gain structure further including a plurality of said active layers said active layers having spacer layers therebetween, said spacer layers having a formula $A_pB_{1-p}C_qD_{1-q}$, where $1.0 \geq p \geq 0.0$, $1.0 \geq q \geq 0.0$, where A and B are selected from a group of group II elements consisting of (Zn, Cd, Mg, Be, Sr, and Ba), and where C and D are selected from a group of group VI elements consisting of (S, Se, and Te); and an InGaN semiconductor light-emitting device arranged to optically pump said laser heterostructure.

13. The laser of claim 12, wherein said semiconductor laser heterostructure is a surface-emitting heterostructure.

14. The laser of claim 13, wherein said semiconductor laser heterostructure includes a first mirror structure and a gain structure, said gain structure including said at least one active layer.

15. The laser of claim 14, further including a mirror spaced apart from said semiconductor laser heterostructure and arranged to form a laser resonator with said first mirror structure, said laser resonator including said gain structure.

16. The laser of claim 14, wherein said semiconductor laser heterostructure further includes a second mirror structure arranged to form a laser resonator with said first mirror structure, with said gain structure being located between said first and second mirror structures.

17. The laser of claim 12, wherein said semiconductor laser heterostructure is an edge-emitting laser heterostructure.

18. The laser of claim 17, wherein laser resonator has first and second reflective facets forming a laser resonator having a longitudinal axis, and said InGaN semiconductor light emitting device includes a linear array of InGaN diode-lasers spaced apart from said semiconductor heterostructure and aligned with said longitudinal axis of said laser resonator.

* * * * *